United States Patent [19]

Kasano, Hiroyuki

[11] 3,745,423

[45] July 10, 1973

[54] OPTICAL SEMICONDUCTOR DEVICE AND METHOD OF MANUFACTURING THE SAME

[75] Inventor: Kasano, Hiroyuki, Akishima-shi, Japan

[73] Assignee: Hitachi, Ltd., Tokyo, Japan

[22] Filed: Dec. 27, 1971

[21] Appl. No.: 212,430

[30] Foreign Application Priority Data

Dec. 25, 1970 Japan .............................. 45/130686

[52] U.S. Cl... 317/234 R, 317/235 N, 317/235 AQ, 317/235 AN

[51] Int. Cl. .......................................... H05b 33/00

[58] Field of Search ................. 317/235 N, 235 AQ, 317/235 AN

[56] References Cited

UNITED STATES PATENTS

| | | | |
|---|---|---|---|
| 3,636,617 | 3/1970 | Schmidt | 29/578 |
| 3,600,240 | 8/1971 | Rupprecht | 148/171 |
| 3,629,018 | 12/1971 | Henderson | 148/187 |
| 3,612,958 | 10/1971 | Saito | 317/234 R |
| 3,617,820 | 11/1971 | Herzog | 317/234 |

OTHER PUBLICATIONS

Nethercot, "I.B.M. Tech. Discl. Bull.," Vol. 12, No. 11, April 1970, page 1862.

Shih, et al., "Jounal of Applied Physics," Vol. 39, No. 3, 15 Feb. 1968, pages 1557–1560.

*Primary Examiner*—Martin H. Edlow
*Attorney*—Craig, Antonelli & Hill

[57] ABSTRACT

Light-emitting semiconductor devices consist of a crystal having a Ge concentration of less than 1 ppm and a p-n junction and the method of manufacturing the same The light-emitting semiconductor device has emission peaks at 1.57 eV in a visible band and can be manufactured inexpensively compared to the coventional light-emitting semiconductor devices.

11 Claims, 9 Drawing Figures

FIG. 1a
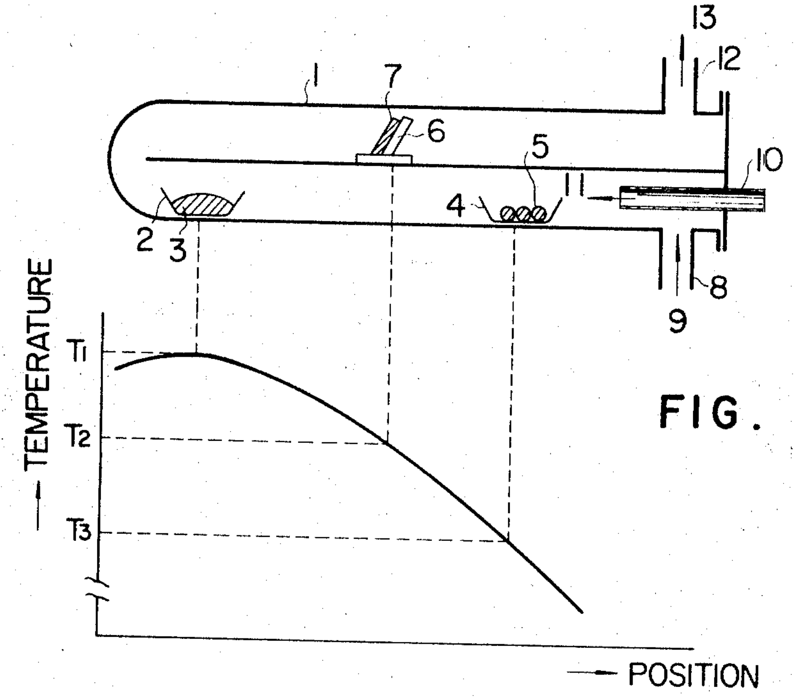
FIG. 1a, FIG. 1b
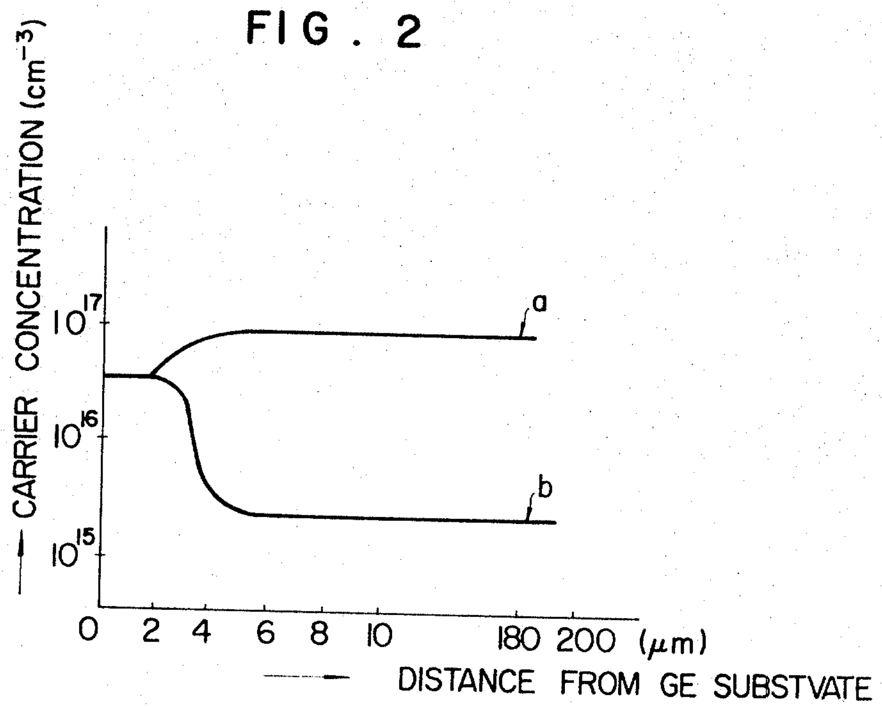
FIG. 2

OPTICAL SEMICONDUCTOR DEVICE AND METHOD OF MANUFACTURING THE SAME

BACKGROUND OF THE INVENTION

This invention relates to light-emitting semiconductor devices and a method of manufacturing the same.

GaP diodes and Ga(P, As) diodes doped with Zn and O are used as conventional light-emitting semiconductor devices. Throughout the specification, the term "Ga(P, As)" generally means a gallium arsenide-phosphide mixed crystal, and where the ratio between the As and P contents is important, it is expressed as "$GaAs_{1-x}P_x$." As a semiconductor material for light-emitting diodes other than the aforementioned semiconductors (Ga, Al) As is very promising. The Ga(P, As) crystal is usually prepared epitaxially from vapor phase by using a single GaAs crystal wafer as the substrate. The vapor phase epitaxial method is usually carried out by utilizing a disproportional reaction which is carried out by supplying a halogen gas. This is made so from the viewpoint of the high purity of the grown crystal, easy handling thereof and mass productivity. The "disproportion reaction" is discussed in an article entitled "Preparation of Crystals of InAs, InP, GaAs and Gap by a Vapor Phase Reaction" by G. R. Antell et al in "Journal of Electrochemical Society," Vol. 106 (issued 1959), pages 509 to 511. It means a balanced reaction which proceeds only in one direction in a high temperature zone or low temperature zone.

The GaAs single crystal is used as the substrate of usual optical semiconductor devices. It does not have any electrically active function. However, it is very difficult to obtain high quality GaAs crystals, which, also, are very expensive, constituting an obstacle in the reduction of the cost of light-emitting diodes. Ge crystals which have large areas and are inexpensively available resemble GaAs crystals in lattice constant and thermal expansion coefficient.

A single crystal of Ge is sold at 25 cents per gram, which is very inexpensive compared to the price of the single crystal GaAs (30 dollars per gram). Thus, it would be a great practical economic benefit if Ge could be used as the substrate in place of GaAs. However, germanium actively functions as an amphoteric impurity for GaAs, GaP and Ga(P, As). Therefore, if it is doped in a great quantity, its donor impurity content and its acceptor impurity concentrations mutually compensate each other, giving rise to complicated electrical phenomena. In the vapor phase growth of GaAs, GaP and Ga(P, As) on the Ge substrate, germanium, which has been transported from the substrate before the substrate is covered by the epitaxial layer and temporarily deposited on the reaction tube wall, is introduced in the vapor phase into the epitaxial layer. This effect is referred to as auto-doping, and it presents significant problems. The role of germanium as an impurity in GaAs has heretofore been investigated in considerable detail. For example, H. Kressel and others have reported in "Journal of Applied Physics," Vol. 39 (issued in 1968), page 4054, that the impurity germanium at a temperature of 77° K provides, beside its shallow donor level, two acceptor levels respectively 0.03 eV and 0.07 eV above the filled band. Also, Gerschenzon and others have reported in "Journal of Applied Physics," Vol. 37 (1966), page 486, that germanium can establish a deep donor level and an acceptor level in GaP and that these donor and acceptor levels as a pair provide a self-compensation effect.

It is also said that doping in GaP, which is already doped with Ge of such a great quantity as to exhibit strong self-compensation effect, with an impurity having a shallow donor or acceptor level, for instance Te or Zn, will not result in any increase of carrier concentration but rather tend to reduce the radiation efficiency. The above reports suggest that if an epitaxial layer of Ga(P, As), mixed crystal of GaAs and GaP is grown on a Ge substrate, there will coexist two impurity levels, namely, deep and shallow levels, established in the epitaxial layer due to the autodoping of Ge into the epitaxial layer. In fact, Burmeister and others have reported in "Transactions of the Metallurgical Society of AIME," Vol. 245 (1969), that Ga(P, As) containing several or more ppm of Ge exhibited a strong self-compensation effect resulting in the reduction of the carrier concentration to below $10^{15}$ $cm^{-3}$ in order and increased resistivity (of above 10 ohm·cm), and that no emission in the visible zone is observed by doping impurity (Se) giving a shallow donor level.

It will be seen that it is the deep impurity level of Ge that impedes visible emission. With the conventional vapor growth method, it is extremely difficult to reduce to below 1 ppm the Ge concentration due to the autodoping of Ge into the epitaxial layer of Ga(P, As) grown on the Ge substrate, and the use of germanium as the substrate for the growth of the crystal of Ga(P, As) for the light-emitting diode material has been almost hopeless.

SUMMARY OF THE INVENTION

An object of the invention is to provide an optical semiconductor device of $GaAs_{1-x}P_x$ (where $1 \geqq x \geqq 0.3$) which is inexpensive and capable of omitting visible light.

According to the invention, in heteroepitaxially growing a compound semiconductor on a germanium substrate the back and side surfaces of the Ge substrate are previously coated with a substance which is stable at high temperatures, for instance Si, for the purpose of reducing the auto-doping of Ge from the substrate into the epitaxial layer so that prescribed $GaAs_{1-x}P_x$ ($1 \geqq x \geqq 0.3$) can be epitaxially grown on the principal surface of the Ge substrate.

It has been found that by using the above epitaxial vapor growth method according to the invention, the Ge content in the epitaxially grown Ga(P, As) can be reduced to below 1 ppm, free electron concentration of the order of $10^{16}$ $cm^{-3}$ can be obtained, and that the resistivity can be reduced to below 0.1 ohm·cm. These results are attributable to the elimination of the self-compensation effect owing to the reduced Ge content. By doping this epitaxial layer with a suitable quantity of such impurity as Te, Se and S capable of providing a shallow donor level, it is possible to further increase the free electron density and further reduce the resistivity. This is extremely advantageous for the improvement of the emission efficiency.

In the optical semiconductor device according to the invention, the concentration of Ge contained in $GaAs_{1-x}P_x$ should be made less than 1 ppm. The intensity of the visible light emission can be further increased by doping one element selected from members of group IV*a* and VI*a* families, Se, Te, S, Sn and Si in a quantity equal to or greater than the content of the auto-doped Ge. Doping such an element in excess of $5 \times 10^{18}$ $cm^{-3}$, however, is meaningless since the nature of the crystal is degradated. Regarding the ratio between As and P contents in the mixed crystal $GaAs_{1-x}P_x$ of the semiconductor device according to the invention, if $x$ is less than 0.3 no visible emission takes place.

Investigation of the room-temperature emission characteristics of p-n junction diodes prepared by diffusing Zn into epitaxially grown Ga(P, As) containing Ge in such a slight quantity that the self-compensation will not take place or containing the aforesaid slight quantity of Ge and a suitable quantity of an impurity giving a shallow donor level reveal that these diodes have two main emission bands, one being a near-infrared emission band with a peak at 1.57 eV and the other being a visible emission band attributable to the recombination of electron-hole pairs, irrespective of the Ge concentration as shown in FIG. 4 and irrespective of the mixture ratio of the mixed crystal as shown in FIG. 5.

The light-emitting semiconductor device according to the invention makes use of Ga(P, As) or GaP which contains in its n-type layer either a slight quantity of Ge or a slight quantity of Ge and a suitable quantity of an impurity with a shallow donor level, and both its room-temperature emission bands or only its visible emission band may be utilized.

BRIEF DESCRIPTION OF THE DRAWINGS

FIG. 1*a* is a longitudinal sectional view of a setup using a reaction tube to carry out the epitaxial growth method of preparing Ga(P, As) for optical semiconductor devices according to the invention.

FIG. 1*b* is a graph showing the temperature gradient in the reaction tube shown in FIG. 1*a*.

FIG. 2 is a graph showing carrier density gradients in epitaxial layers grown on the principal surface of a Ge substrate having the back and side surfaces thereof previously coated with $SiO_2$ and Si, measured in the direction of growth of the epitaxial layers from the substrate.

DESCRIPTION OF THE PREFERRED EMBODIMENTS

Figure 3:
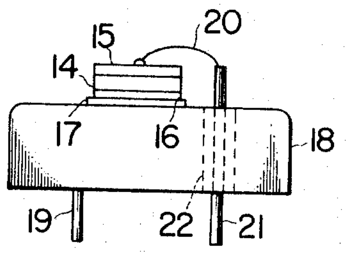
FIG. 3 is a sectional view showing an optical semiconductor device according to the invention.

The invention will now be described in conjunction with some preferred embodiments.

Embodiment 1

A substrate cut from an n-type Ge single crystal ingot with (111) orientation and a mirror surface was used, and its back and side surfaces were covered beforehand by chemical vapor deposition with $SiO_2$ – Si double films of about 1 micron thick. Then, the front surface of the substrate was exposed by grinding with a 3,000-mesh alumina powder. Thereafter, Ga was deposited on the lapped surface of the substrate with thickness of about 1 to 2 microns. After the deposition, the substrate was attached to a substrate holder made of quartz, which was then disposed together with a quartz boat filled with 6 grams of Ga and 0.3 gram of red phosphorus and another quartz boat filled with about 0.5 gram of red phosphorus at their respective predetermined positions within a reaction tube also made of quartz, as shown in FIG. 1*a*.

Referring to FIG. 1*a*, reference numeral 1 designates the quartz reaction tube, numeral 2 the first quartz boat, numeral 3 the high temperature mixture source of (Ga + P), numeral 4 the low temperature source of P, numeral 6 the quartz substrate holder, numeral 7 and Ge substrate, numeral 8 and 10 gas inlets, numeral 9 dilution hydrogen, numeral 11 reaction gas, numeral 12 a gas outlet, and numeral 13 exhaust gas. The temperature gradient at overgrowth along the axis of the reaction tube 1 is shown in FIG. 1*b*, in which the ordinate represents temperature and the abscissa is taken for the distance from the closed tube end. The reaction tube 1 carrying the arrangement of the reactants as shown in FIG. 1*a* was placed within a horizontal resistance heating furnace (not shown). Then, hydrogen was supplied at a total rate of 300 cc/min. from both the gas inlets for about one hour, and then the temperature of the electric furnace was raised to the predetermined temperatures of $T_1 = 950°$ C, $T_2 = 830°$ C and $T_3 = 390°$ C as shown in FIG. 1*b*. Approximately 10 minutes later, the flow rate of hydrogen through the inlet 8 was regulated to be about 60 cc/min. while, at the same time, hydrogen saturated with $PCl_3$ (under vapor pressure of 36 Torr) was supplied through the gas inlet 10 at a rate of 90 cc/min. 6 hours thereafter, the temperature was lowered, the sample was taken out and the GaP was found to be grown to a thickness of 200 $\mu m$ on the substrate. The substrate was then lapped to obtain only the epitaxial layer. On the fringe of the surface of the epitaxial layer four particles of In containing 5 percent of Sn (by heating the system in hydrogen atmosphere at a temperature of 420° C for 3 minutes were then alloyed to carry out the Hall effect measurement by the Pauw's method (shown in "Philips Research Reports," Vol. 13 (1968), page 1).

The carrier density in the epitaxial layer was found to be $3.5 \times 10^{15}$ $cm^{-3}$, and the electron mobility at room temperature was found to be 145 $cm^2/Vsec$. Also, by observing the boundary between the substrate and the epitaxial layer at a one degree angle-lapped surface, a disturbed structure adjacent the boundary was found to have inclusions of Ge within the epitaxial layer. This indicates that in the inital stage of growth, the surface of Ge was melted to form an alloy with Ga and P, so that the crystal growth was started from solution. Investigation of the impurity distribution in the direction of the thickness of the epitaxial layer made by the point contact breakdown method using metal needles erected on the aforementioned slant ground surface reveals that the carrier density is $5 \times 10^{16}$ $cm^{-3}$ for a region within a depth of about 2 $\mu m$ from the Ge face and it is about $3.5 \times 10^{16}$ $cm^{-3}$ for a region beyond a depth of 5 $\mu m$, as indicated by curve b in FIG. 2.

In another sample, GaP was epitaxially grown by using a Ge substrate with the back and side surfaces covered with Si but with the front surface not covered with Ga and under the same growing conditions as in the case of the previous sample. The thickness of the epitaxial layer was about 180 μm. The carrier density of the GaP epitaxial layer thus obtained was measured to be $9 \times 10^{16}$ $cm^{-3}$, and the electron mobility thereof (at room temperature) was 125 $cm^2$/Vsec. Also, similar to the above case of the first sample the carrier density gradient in the direction of thickness of the epitaxial layer was investigated on a slant ground face to find that there was a sink in the carrier density within a depth of about 2 μm from the Ge face and for the region beyond a depth of 5 μm the carrier density was found to be $9 \times 10^{16}$ $cm^{-3}$.

In both of the above samples, the back and side surfaces of the substrate remained completely coated with Si, even after the reaction. This indicates that Ge will not be introduced into the epitaxial layer from the back and sides of the substrate. The difference in the carrier density between both the samples indicates that Ge atoms were vaporized from the surface of the Ge substrate into the vapor phase and deposited on the reaction tube wall before the epitaxial layer covered the surface of the Ge substrate when the Ge substrate, the front surface of which was not covered with Ga, was used.

In a further sample, GaP was epitaxially grown by using a GaAs substrate with the back and side surfaces coated with Si and under the same growing conditions as in the above cases, and the carrier density in the resultant epitaxial layer was found to be $2.5 \times 10^{15}$ $cm^{-3}$. Thus, with the Ge substrate having its back and side surfaces coated with $SiO_2$ and Si and its front surface coated with Ga the effect of auto-doping of Ge (generation of the aforementioned secondary auto-doping source) could be thought to be substantially eliminated. The carrier density of $3.5 \times 10^{15}$ $cm^{-3}$ in the GaP epitaxial layer, which is observed in case of using a Ge substrate having the front surface coated with Ga, is attributable to the germanium slightly doped in the GaP layer. From chemical analysis, the Ge concentration was found to be 0.4 ppm.

After the GaP layer was epitaxially grown on the Ge substrate in the above manner, the Ge substrate was removed by lapping. Then, Zn was diffused into the GaP layer containing 0.4 ppm of Ge to form a p-type GaP region about 3 μm thick. Thereafter, the face of the GaP layer which had been contiguous to the Ge substrate was lapped to about 20 μm, and on the ground surface of Au-Ge-Ni alloy was formed. Then, the resultant wafer was cut into a chip having dimensions of 0.5 × 0.5 $mm^2$. The side of the tip having the Au-Ge-Ni alloy was then mounted on a diode stem by means of a Sn-In alloy. Also, a particle of an Au-Zn alloy was provided as the resistive electrode on the p-type region side of the tip. By causing forward current of 20 mA through this diode thus produced, bright yellow-greenish luminescence was observed. Analysis of the luminescence spectrum by using a spectrometer revealed that there were a strong green emission band with peak emission at 5,650 A, a weak red emission band with peak emission at 6,880 A and a weak near-infrared emission band with peak emission at 8,000 A (1.57 eV).

Embodiment 2

In this embodiment, the invention is applied to the manufacture of semiconductor devices using a mixed crystal Ga(P, As) epitaxially grown on a Ge substrate and containing Ge and Te, as an impurity giving a shallow donor level.

Similar to the previous setup shown in FIG. 1*a*, quartz boat 2 filled with metallic Ga and polycrystal GaAs as high temperature source 3 was disposed in a high temperature zone in the quartz reaction tube 1, while the Ge substrate 7 having back and side surfaces coated with polycrystal Si was disposed in a low temperature zone. Then, $AsH_3$ and $PCl_3$ were supplied together with $H_2$ as the carrier gas through gas inlet 10 into the reaction tube, while simultaneously $H_2Te$ diluted with $H_2$ was supplied through gas inlet 8 into the tube for epitaxially growing Ga(P, As) through disproportional reaction. In this embodiment, no low temperature source like the one 5 in the first embodiment was used. The mixture ratio of the mixed crystal Ga(P, As), that is, the proportions of As and $P$ in $GaAs_{1-x}P_x$ expressed in terms of $x$, can be set to a desired value by appropriately selecting the mole ratio between $PCl_3$ and $AsH_3$ introduced into the reaction system. In the instant embodiment, P was selected to be 40 percent and As to be 54 percent. Also, substantially $2 \times 10^{17}$ $cm^{-3}$ of Te was doped into the epitaxial layer. On the other hand, the concentration of Ge doped in the epitaxial layer depends upon the extent of auto-doping of Ge from the substrate, and it can be controlled by appropriate adjusting the temperature of the Ge substrate and the mole ratio of $PCl_3$ and can be determined from chemical analysis.

After the epitaxial layer of Ga(P, As) doped with Ge and Te was obtained in the above manner, the substrate was removed from the epitaxial layer by means of lapping and chemical etching. Then, Zn, a p-conductivity type impurity, was thermally diffused into the Ga(P, As) layer to form a p-type region having a thickness of about 3μm. Then, the other side of the sample than the p-type region was ground by about 20μm, and the ground surface was plated with Ni.

The wafer thus obtained was then cut into a rectangular chip having dimensions of 0.5 × 0.5 $mm^2$. Then, the side of the chip plated with Ni was mounted on a diode stem by means of an Au-In alloy as the n-type region side resistive electrode. Then, a Au lead resistive electrode was bonded to the p-type region of the chip.

FIG. 3 shows a Ga(P, As) light-emitting diode produced in the above manner. In the Figure, reference numeral 14 designates n-type region of the Ga(P, As) layer, numeral 15 p-type region of the Ga(P, As) layer, numeral 16 Ni layer, numeral 17 Au-In alloy electrode, numeral 18 diode stem, numeral 19 lead, numeral 20 Au lead, numeral 21 lead, and numeral 22 insulating glass.

Figure 4:
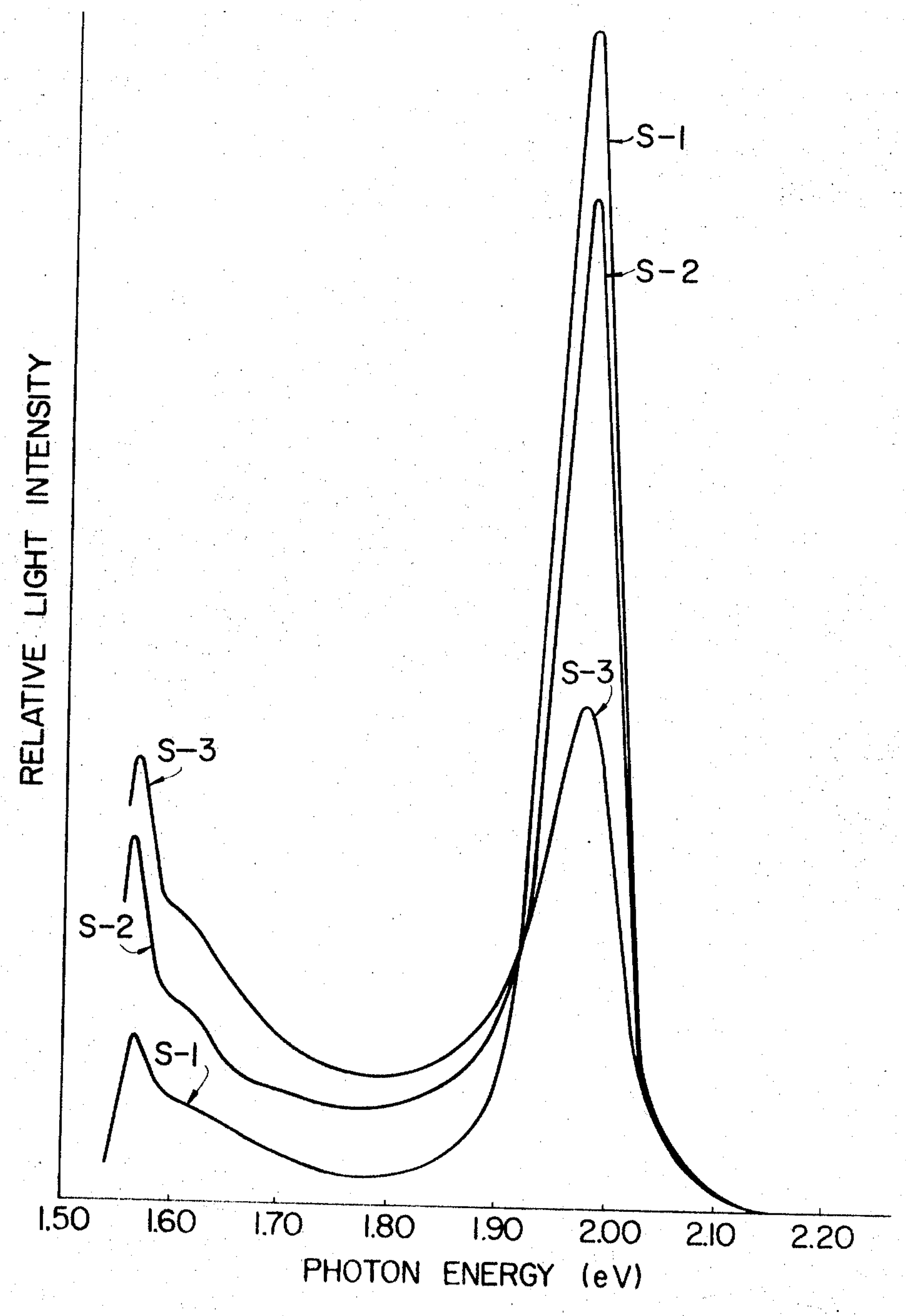
FIG. 4 is a graph showing the relative emission strength of optical semiconductor devices of Ga(P, As) with different concentrations of Ge.

FIG. 4 shows emission spectra of three light-emitting diodes of a construction as shown in FIG. 3 and having different Ge concentrations. These curves were obtained by causing forward current of 20 mA through the diodes at room temperature. It will be seen from the Figure that there are a visible emission band with a peak at 1.98 eV and a near-infrared emission band with a peak at 1.57 eV, with the relative intensity of the former band being stronger than that of the latter band.

The emission with peak intensity at 1.98 eV covers an energy gap close to the forbidden gap and determined by the mixture ratio of the mixed crystal $GaAs_{1-x}P_x$ where $1 \geqq x \geqq 0.3$. This emission has heretofore been observed with light-emitting diodes of the Ga(P, As) mixed crystal. It is thought to result from recombination of electrons in the conduction band with holes captured in the acceptor level. On the other hand, the emission with peak intensity at 1.57 eV (and covering an energy gap considerably smaller than the forbidden gap) is not observed with Ga(P, As) that has been grown on a GaAs substrate, unles the epitaxial crystal is doped with Ge. Its peak intensity energy level does not vary with variations in the Ge concentration, as shown in FIG. 4. From this fact, the near-infrared emission is thought to be added by the deep impurity level of Ge. However, if the concentration of the doped Ge is above several ppm, the self-compensation effect of Ge is pronounced so that no visible emission can be observed. The luminance of emission when a forward current of 20 mA was caused through a diode in which the concentration of Ge was held to be about 0.1 ppm (corresponding to curve S–1 in FIG. 4) was found to be about 180 fL. The curves S–1, S–2 and S–3 in FIG. 4 represent emission characteristics of the three GaAsP diodes with Ge concentrations of 0.1 ppm, 0.13 ppm and 0.7 ppm, respectively.

The visible emission characteristics of the diodes of $GaAs_{1-x}P_x$ (with $1 \geqq x \geqq 0.3$) according to the instant embodiment of the invention, depends upon the concentration of Ge in $GaAs_{1-x}P_x$. When the concentration is 0.7 ppm, the emission intensity ratio, that is, the intensity of visible radiation divided by the intensity of infrared radiation, substantially equals unity. With concentrations above 1 ppm visible emission can hardly be observed due to the afore-mentioned self-compensation effect. This means that, in order to provide increased intensity of visible emission of the $GaAs_{1-x}P_x$ diode produced by using a Ge substrate, it is necessary to adopt a manufacturing method by which the degree of auto-doping of Ge from the substrate into the epitaxial layer is maintained less than 1ppm.

Also, without the Ge substrate but with other substrates (for instance, a GaAs substrate) by suitably incorporating Ge within a range less than 1 ppm into the diodes of $GaAs_{1-x}P_x$ (with $1 \geqq x \geqq 0.3$) it is possible to desirably adjust the emission peaks in the near-infrared and visible emission bands according to the Ge concentration. To epitaxially grow Ga(P, As) by using substrates other than the Ge substrate by the epitaxial method according to the instant embodiment of the invention, the back and side surfaces of the selected substrate 7 may be coated with $SiO_2$, and $H_2Te$ diluted with hydrogen and $GeH_4$ also diluted with a desired quantity of hydrogen may be introduced through the gas inlet 8 of the reaction tube 1 in the setup of FIG. 1. The Ge concentration in the $GaAs_{1-x}P_x$ layer grown on the substrate by this method depends upon the mole concentration of $GeH_4$ in hydrogen. In this case, the substrate (for instance GaAs) need not be removed after the epitaxial layer is grown, and the $GaAs_{1-x}P_x$ layer thus obtained may be processed into a desired light-emitting semiconductor device in the same manner as the afore-described process of the instant embodiment.

The wavelength of visible light may be desirably varied according to the forbidden gap of the $GaAs_{1-x}P_x$ and, hence the proportion ratio between As and P. In the case of a Ga(P, As) crystal, the forbidden gap of visible light radiation can be obtained when $1 \geqq x \geqq 0.3$, as mentioned earlier.

Embodiment 3

Three light-emitting diodes providing different colors of luminescence were manufactured by the same method as in the second embodiment and varying the mixture ratio $x$ between As and P in $GaAs_{1-x}P_x$ (with $1 \geqq x \geqq 0.3$), which was grown on a Ge substrate and doped with Ge and Te. The concentrations of Te and Ge were substantially held at $2 \times 10^{17}$ cm $^{-3}$ and at 0.1 ppm respectively. The mixture proportions were 47 percent phosphorous and 53 percent arsenic for diode A, 42 percent phosphorus and 68 percent arsenic for diode B, and 33 percent phosphorus and 67 percent arsenic for Diode C. Zinc was diffused into the individual mixed crystals.

Figure 5:
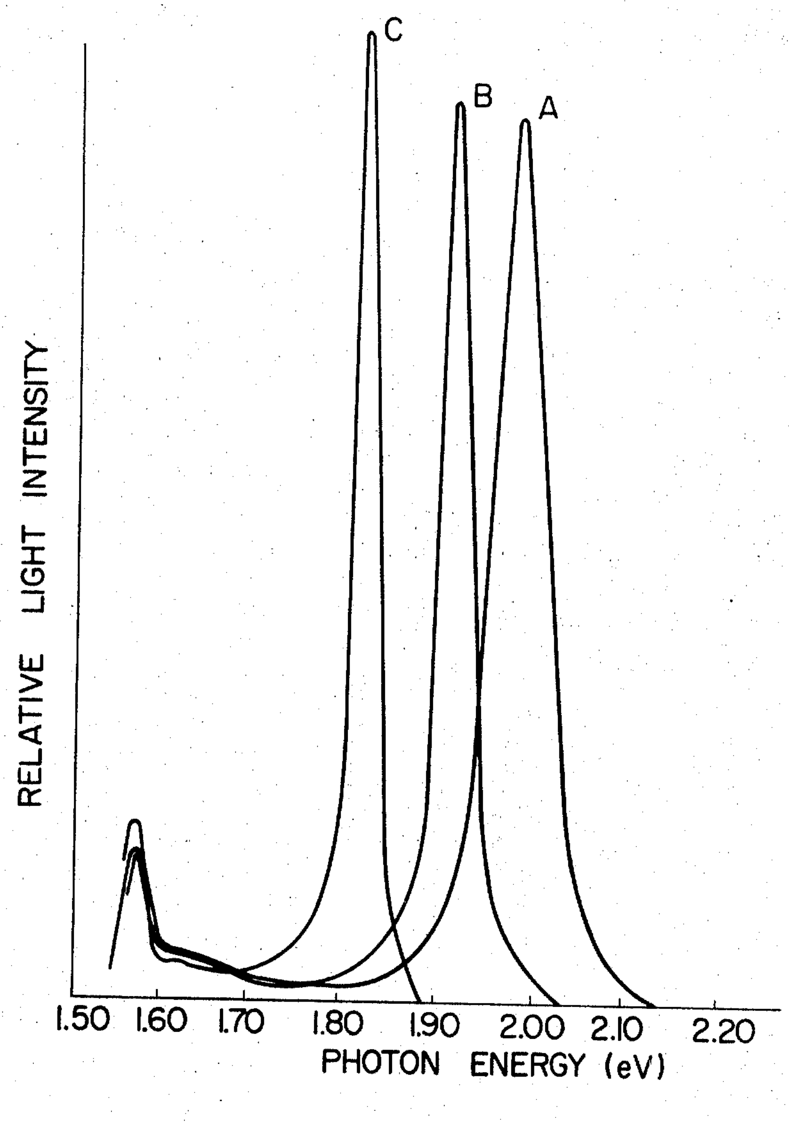
FIG. 5 is a graph showing the relative emission strength of optical semiconductor devices of $GaAs_{1-x}P_x$ with different mixture ratios (x) between As and P.

FIG. 5 shows the emission spectra of the three light-emitting diodes are room temperature. It will be seen that there are two main emission levels (one at 1.57 eV and the other in the visible band) similar to the spectra in the second embodiment. The visible emission band which is near the forbidden gap has an emission peak at 1.99 eV in sample A, at 1.92 eV in sample B and at 1.82 eV in sample C. It is due to indirect transition type recombination in case of the sample A and due to direct transition type recombination in case of the samples B and C. On the other hand, the near infrared emission band has a constant peak intensity energy level of 1.57 eV independent of the mixture ratio of the mixed crystal. The emission spectra of GaP grown while doping Ge and Te on a Ge substrate in the same manner as in the case of growing $GaAs_{1-x}P_x$ (with $1 \geqq x \geqq 0.3$) also had a near-infrared emission band with emission peak at 1.57 eV beside a broader green and red emission band. When the concentration of the doped Ge is low enough, however, the emission intensity of the near-infrared emission (1.57 eV) is about 10 percent of the emission intensity of the visible emission band, and the luminance of emission is not so inferior. When forward current of 20mA was injected to the above three diodes, sample B showed a highest luminance of 350 fL.

Embodiment 4

The same vapor growth method as described in the second embodiment was used in epitaxially growing an n-type $GaAs_{0.7}P_{0.3}$ layer of 10 $\mu$m thick on a p-type (or n-type) Ge single crystal substrate with back and side surfaces coated with Si and having a resistivity of 0.3 ohm·cm. The Ge concentration in the $GaAs_{0.7}P_{0.3}$ layer was selected to be somewhere between 0.4 and 0.8 ppm, and the Te concentration therein to be $5 \times 10^{17}$ $cm^{-3}$. After growing the $GaAs_{0.7}P_{0.3}$ layer, the Si coating film of the Ge substrate was removed, and then the back of the substrate was ground until the thickness of the overall sample was reduced to be 150 $\mu$m. Then, the wafer was cut into a chip with dimensions of $5 \times 5$ $mm^2$, which was then set on a diode stem, as shown in FIG. 7.

Figure 7:
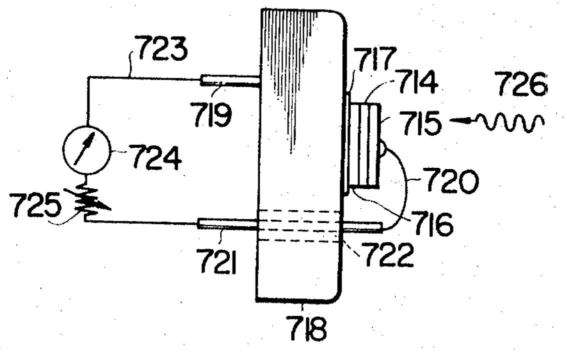
FIG. 7 is a sectional view of an optical semiconductor device according to the invention applied to a solar cell.

In FIG. 7, numeral 714 designates the Ge substrate, numeral 715 the $GaAs_{0.7}P_{0.3}$ layer, numeral 716 a Ni plated layer, numeral 717 an Au-In alloy electrode, numeral 718 the diode stem, numerals 719 and 721 leads, numeral 720 a Au lead, numeral 722 an insulator, numeral 723 a lead, numeral 742 a millivolt meter, and numeral 725 an external resistor.

When the $GaAs_{0.7}P_{0.3}$ layer 715 of this device is exposed to sunlight 726, an electromotive force is produced in the diode and which may be measured by the millivolt meter 724.

Figure 6:
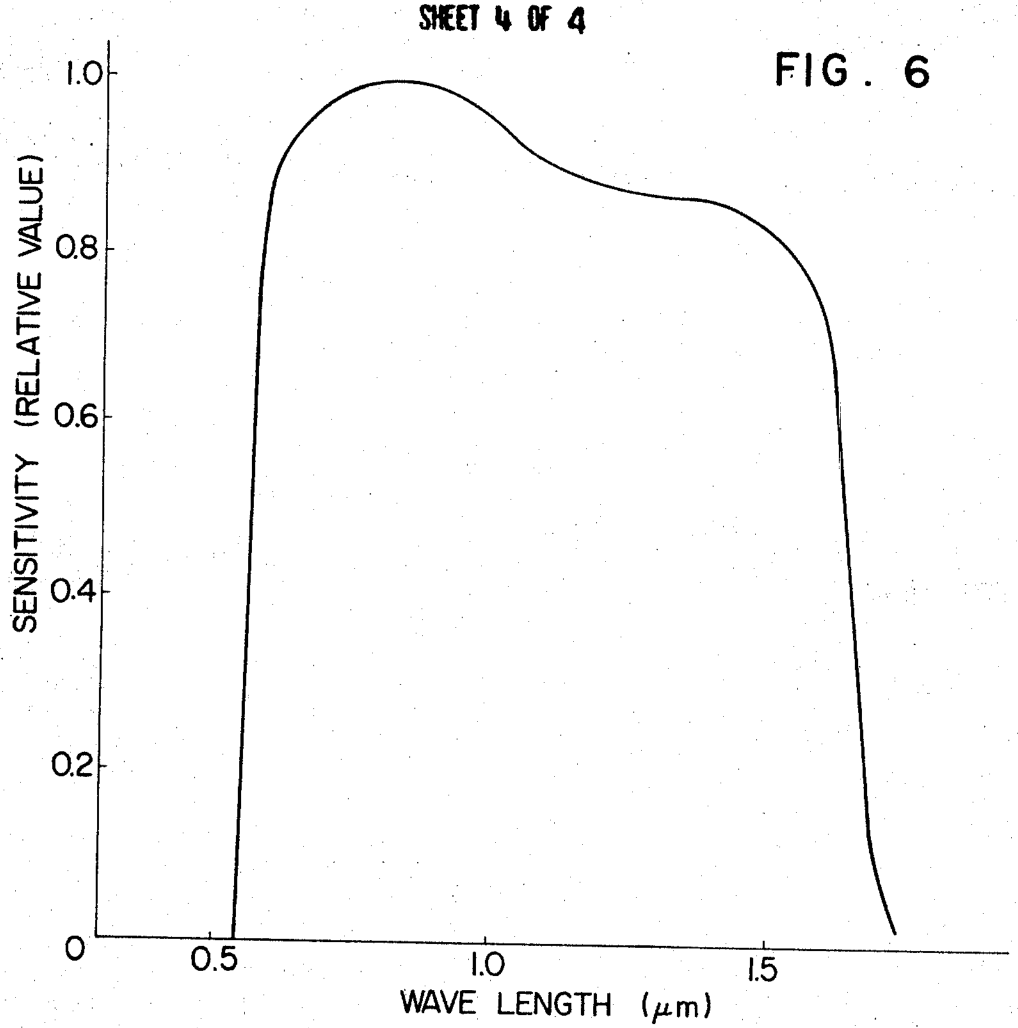
FIG. 6 is a plot showing the relative spectral sensitivity of an optical semiconductor device according to the invention applied to a solar cell.

FIG. 6 shows the relative spectral sensitivity of the heterojunction between $GaAs_{0.7}P_{0.3}$ and Ge layers in the device of FIG. 7. The photoelectric convertion efficiency of a solar cell using this heterojunction was 10 percent, which is high compared to the photoelectric convertion efficiency of conventional heterojunction solar cells and GaAs solar cells. This increase of the photoelectric convertion efficiency is attributable to the fact that long wavelength components of light are absorbed by the Ge substrate while short wavelength components of light (particularly in the vicinity of 1.76 eV at which there is a peak of quantum distribution of sunlight) are absorbed by the $GaAs_{0.7}P_{0.3}$ layer doped with Ge.

Embodiment 5

Figure 8:
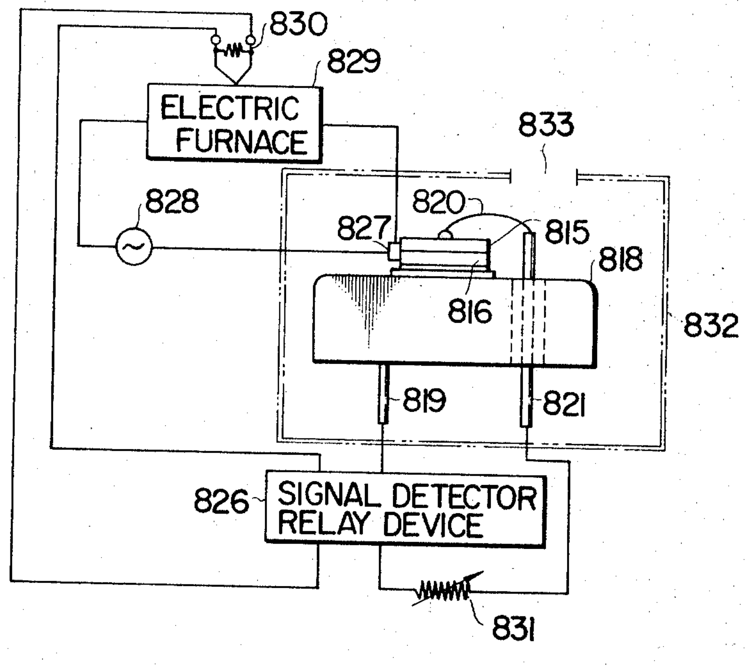
FIG. 8 is a sectional view of another application of the optical semiconductor device according to the invention combined with an optical detector.

Referring to FIG. 8, a silicon photodiode 827 (doped with boron) having a light sensitivity peak at 1.57 eV is provided on the p-n junction of the optical semiconductor device of the second embodiment and having the construction of FIG. 3. The Si diode 827 is connected through a power source 828 to a load 829 which is furnished with power under a predetermined switching control (for instance an electric furnace). The input to the load 829 is to be closed when the load is heated to a predetermined temperature. (Thus, the load should be connected to a switching means to switch its input according to a switching demand.) In this apparatus, the coupler consisting of the light-emitting diode and silicon photodiode is disposed within a black box 832 having a top window 833. Also, an information signal detection relay 826 (activated by detecting the difference between an information signal from an information signal generator 830 and a preset value), a battery 826 and an external resistor 831 are connected in series between leads 819 and 821 of the optical semiconductor device.

In the operation of the apparatus of the above construction, when the relay is turned "on," visible rays and near-infrared rays are emitted from the p-n junction of the optical semiconductor device. The silicon photodiode detects the near-infrared rays to produce in it a photoelectron current, which is utilized to on-off control the power source 828, thereby controlling the current flowing in the load 829. If the load 829 is energized, the state of the load may be observed by the eye from the visible light penetrating the window 833 of the black box 832.

The light sensitivity of the silicon photodiode (serving as a detector) in the instant embodiment may be controlled by varying the kind and extent of doping of the impurity such as boron. If it is adjusted to coincide with the peak of the near-infrared emission band of the optical semiconductor device according to the invention, a light detector having an excellent performance may be obtained. Also, it is a merit of the apparatus of the instant embodiment that the operation of the optical semiconductor device may be confirmed by the visible light therefrom.

What I claim is:

1. An optical semiconductor device comprising a crystal in which a p-type region and an n-type region are formed so as to have a p-n junction and a composition expressed by the formula $GaAs_{1-x}P_x$ where $1 \geqq x \geqq 0.3$ and said crystal has a Ge concentration of greater than 0 but less than 1 ppm, and a pair of current injection electrodes respectively provided on the p-type and n-type regions of said crystal.

2. The optical semiconductor device according to claim 1, wherein said crystal is doped with at least one element selected from the group consisting of IVa and VIa families in the periodic table of the elements in a quantity between $1 \times 10^{16}$ cm$^{-3}$ and $5 \times 10^{18}$ cm$^{-3}$.

3. An optical semiconductor device comprising a germanium crystal substrate, a crystal having a conductivity type opposite to that of said substrate and a composition expressed by a formula $$GaAs_{1-x}P_x$$

where $1 \geqq x \geqq 0.3$, said crystal containing more than 0 but less than 1ppm of germanium, and a pair of electrodes respectively provided on said crystal and on said substrate.

4. The optical semiconductor device according to claim 3, wherein said crystal of $GaAs_{1-x}P_x$ (with $1 \geqq x \geqq 0.3$) further contains at least one element selected from a group consisting of group V1*a* and group 1V*a* families of the periodic table of the elements in a quantity between $1 \times 10^{16}$ cm$^{-3}$ and $5 \times 10^{18}$ cm$^{-3}$.

5. A semiconductor device comprising:

a crystal of $GaAs_{1-x}P_x$, wherein $1 \geqq x \geqq 0.3$, having therein a first region of a first conductivity type and a second region of a second conductivity type forming a pn junction therebetween and a germanium concentration >0 but <1ppm, and further including a pair of electrodes respectively disposed on said first and second region.

6. A semiconductor device according to claim 5, wherein said region of a first conductivity type includes a dopant of at least one element selected from a group consisting of IV*a* and VI*a* families in the periodic table of elements in a quantity between $1 \times 10^{16}$ cm$^{-3}$ and $5 \times 10^{18}$ cm$^{-3}$.

7. A semiconductor device according to claim 6 wherein said first region includes a p type conductivity therein and further including a metallic layer affixing one of said electrodes to one of said regions.

8. A semiconductor device according to claim 5, further comprising means coupled to said electrodes, for injecting a current into said crystal, whereby said crystal will generate visible light and function as a light emitting diode.

9. A semiconductor device comprising:

an n-type germanium substrate;

a layer of $GaAs_{1-x}P_x$, wherein $1 \geqq x \geqq 0.3$, formed on said germanium substrate; and a pair of electrodes respectively disposed on said substrate and said layer.

10. A semiconductor device according to claim 9, wherein said crystal has the formula $GaAs_{0.7}P_{0.3}$.

11. A semiconductor device according to claim 9, wherein said layer has a germanium concentration between 0.4 and 0.8 parts per million.

* * * * *